United States Patent [19]

Wilby

[11] Patent Number: 4,943,845
[45] Date of Patent: Jul. 24, 1990

[54] THICK FILM PACKAGES WITH COMMON WAFER APERTURE PLACEMENT

[75] Inventor: John L. Wilby, Ottawa, Canada

[73] Assignee: Northern Telecom Limited, Montreal, Canada

[21] Appl. No.: 227,543

[22] Filed: Aug. 2, 1988

[51] Int. Cl.$^5$ .................... H01L 23/12; H01L 23/14; H01L 23/08

[52] U.S. Cl. ........................................ 357/74; 357/80; 357/71

[58] Field of Search ............................ 357/80, 74, 71; 361/412, 413, 414, 395, 403; 174/255, 258, 262, 265, 267

[56] References Cited

U.S. PATENT DOCUMENTS

| | | | |
|---|---|---|---|
| 4,541,035 | 9/1985 | Carlson et al. | 361/395 |
| 4,706,165 | 11/1987 | Takenaka et al. | 361/414 |
| 4,736,521 | 4/1988 | Dohya | 174/255 |
| 4,821,142 | 4/1989 | Ushifusa et al. | 361/395 |
| 4,821,151 | 4/1989 | Pryor et al. | 361/403 |

*Primary Examiner*—Rolf Hille
*Assistant Examiner*—S. V. Clark
*Attorney, Agent, or Firm*—Philip W. Jones

[57] ABSTRACT

A multilayer thick film package for housing a microchip is formed from a series of insulating wafers. A wafer adapted to occupy an outer position on the package has a first series of apertures positioned to correspond with the placement of pins on the package, and wafers adapted to occupy inner positions on the package each have a second series of apertures. The second series of apertures is comprised of apertures that correspond in position to the first series of apertures, but is also comprised of additional apertures. Conductive material in the additional apertures allows electrical connection to be made within the package to the conductive lines that extend from the pins of the package to the inner package interface adapted to abut to a microchip. Two forms of the electrical connections are discussed. One form related to connection of some of the conductive lines on a wafer to an electrically conductive coating at ground potential on one of the other wafers, this form being used in frequency sensitive applications. Another form relates to connection of some of the conductive lines on a wafer to a parallel line or lines on another wafer for reducing the resistance in the line in power sensitive applications. Packages capable of housing a variety of microchips may be formed from wafers each having only a first or a second series of apertures, thus reducing hard tooling cost.

6 Claims, 2 Drawing Sheets

THICK FILM PACKAGES WITH COMMON WAFER APERTURE PLACEMENT

This invention relates to a multilayer thick film package for housing a microchip, and more particularly, to packages capable of housing a variety of microchips and formed from wafers with corresponding aperture placement.

Multilayer thick film packages are formed by adjacent placement of insulating wafers formed from a sheet of green alumina or similar material. After apertures have been punched or otherwise produced in each wafer and filled with a metal or other conductive material, a conductive coating is applied to each wafer. A metal such as, for instance, titanium is usually used for the coating, and such coating is often referred to as metallization. The wafers are pressed together to form the layers of a package, and the package is heated in a furnace to form a ceramic. The placement of the apertures in the wafers, the filling of those apertures with metal, and the metallization applied to the wafers is an integrated process directed toward transferring inputs on the pins of the package to wire contact positions adjacent the package cavity in which the microchip is mounted. The pin placement on one of the outer layers of each package normally assumes the form of a standard pin grid array (PGA), 68-pin and 84-pin PGA packages being common arrangements. Each pin is adapted to extend in-line with an aperture in the outer layer. The other outer layer normally has no apertures except for a large central opening which defines part of the package cavity. Each of a series of inner layers usually also has the large central opening, and also has a series of apertures similar to the apertures on the outer layer that bears the pins. Both the number of apertures and their placement on each inner layer is variable, but is often the same as on the outer layer.

The cost of producing multilayer thick film packages for microchips normally entails two costs, which are referred to as hard tooling cost and soft tooling cost. Hard tooling cost refers to the cost of constructing tooling for producing the wafers from the raw sheet material and for producing the apertures in those wafers; a punching process is often used. This cost, which is one that is encountered whenever a design requires a unique placement of the apertures on a wafer, is considerably greater than the cost for soft tooling, which essentially refers to the metallization of the wafers. When producing packages for various microchips, production cost can be reduced by utilizing packages embodying thick film layers having the same arrangement of apertures. Under this scheme, an initial hard tooling cost is still encountered; however, once produced, that tooling can be used to produce the wafers for a series of microchip packages. The wafers for those packages require only differences in metallization, i.e. a soft tooling cost.

The subject invention is a multilayer thick film package formed from a series of insulating wafers of corresponding external profile. A first form of wafer defines an outer layer of the package, that first form of wafer having a first series of apertures in it. The apertures are adapted to be filled with a conductive material for connecting with pins that will extend from the package. A second form of wafer defines each inner layer of the package, each second form of wafer having a second series of apertures in it adapted to be filled with conductive material. The second series of apertures comprises a series of apertures corresponding to the first series of apertures in number and position, and also comprises a third series of apertures lacking such correspondence. Electrical connections from the microchip to the package pins are adapted to be made by selective patterning of an electrically conductive coating on the first and second forms of wafer. The packages for a variety of microchips can be prepared by utilizing a common first form of wafer and a common second form of wafer by varying the pattern of the conductive coating on those wafers.

In a first form of the thick film package of the invention, the conductive coating may extend over substantially all of one surface of the outer layer and over substantially all of one surface of a first one of the inner layers. The conductive coating on each of those layers is electrically- connected with the conductive material in only some of the apertures extending into the plane of the conductive coating. A second one of the inner layers has electrically conductive lines extending generally radially on its surface. Each of those conductive lines connects to the conductive material in a respective one of the first series of apertures and to the conductive material in an associated one of the third series of apertures, as well as to an associated wire contact position adjacent to the microchip cavity. The outer layer and the first one of the inner layers is electrically connected to the conductive material in at least one of the first series of apertures and to the conductive material in at least one of the third series of apertures. The other of the outer layer and the first one of the inner layers is electrically connected to the conductive material in at least one of the remainder of the first series of apertures and to the conductive material in at least one of the remainder of the third series of apertures. Power and ground voltages can be transferred from defined pins of the package to defined wire contact positions adjacent to the microchip cavity by selective conductive coating of the wafers adapted to form the outer layer and the first inner layer. This form of the invention creates a controlled impedance environment for frequency sensitive applications.

In a second form of the thick film package of the invention, the outer layer and the first one of the inner layers each have electrically conductive lines extending generally radially on their surface. Each of the conductive lines on the first one of the inner layers extends from the conductive material in a respective one of the first series of apertures to an associated wire contact position adjacent to a cavity housing the microchip. Each of the conductive lines on the first one of the inner layers also contacts the conductive material in an associated one of the third series of apertures. Conductive lines on the outer layer each extend from the conductive material in a respective selective one of the first series of apertures to the conductive material in the associated one of the third series of apertures. With this arrangement, the resistance between each pin of the package and the associated wire contact position can be varied according to the conductive coating applied to the wafer adapted to form the outer layer of the package. At least one other of the inner layers may have conductive lines extending generally radially on its surface. Each of those conductive lines extends from the conductive material in a respective selected one of the first series of apertures to the conductive material in an associated one of the third series of apertures. With this further arrangement, the resistance between each pin of the package and the associated wire contact position can be varied according to the pattern of the conductive coating applied to the wafers adapted to form the outer layer and the at least one other of the inner layers of the package. This form of the invention is useful for power sensitive applications.

The package may have a generally square profile, and the first series of apertures may be arranged in an array, each of those apertures being spaced 0.1 inches from each adjacent aperture of the first series.

The invention will next be described in terms of a preferred embodiment utilizing the accompanying drawings, in which.

Figure 1:
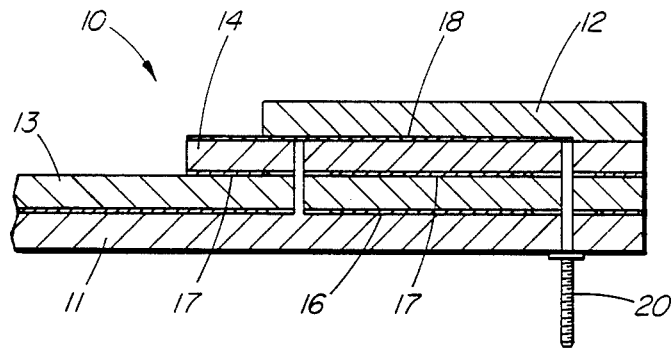
FIG. 1 is a cross-sectional side view of a first form of the package of the invention, metallization on both a ground layer and a power layer being shown as unconnected to a signal line.

A four-layer thick film package formed from four stacked wafers is shown in cross-section and generally designated as 10 in FIG. 1. The package 10 has a first outer layer or base layer 11, a second outer layer or cover layer 12, and a pair of inner layers 13 and 14. Metallization 16 extends on the surface of base layer 11, metallization 17 extends on the surface of inner layer 13, and metallization 18 extends on the surface of inner layer 14. A central opening in cover layer 12 and inner layer 14 defines the cavity in which the microchip (not shown) is housed in the package. A pin extending from the package is designated 20.

Figure 5:
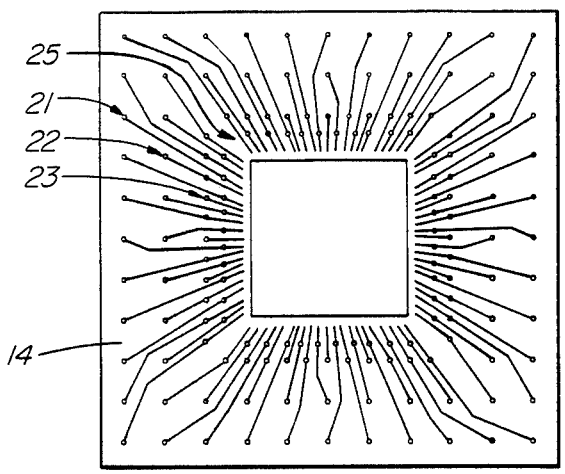
FIG. 5 is a plan view of a wafer utilized as one of the inner layers in both the first and second forms of the package of the invention.

The metallization 18 on the surface of inner layer 14 is configured as a series of lines extending generally radially. This is shown in the plan view of inner layer 14 in FIG. 5. An 84-pin PGA has 40 pins in its outer row, 32 pins in its next row, and 12 pins in its inner row. These sets of pins correspond respectively in position to the apertures designated 21, 22 and 23 in FIG. 5. The number of apertures on base layer 11 matches the number of pins, i.e. 84. However, inner layers 13 and 14 each have 72 additional apertures, the metal in each of the outer two rows of apertures connecting with the metal in a respective one of the 72 additional apertures. On each of the four sides of the plan view of FIG. 5, eight of the additional apertures can be seen to be in-line with the three apertures 23 on the respective side, and ten of the additional apertures are positioned on a still inner row. The metal in the apertures 23 does not contact any of the additional apertures. Each of the metallic lines terminates at a wire contact position within the package cavity adjacent to the position to be occupied by the microchip; these inner ends of the metallic lines are designated 25 in FIG. 5.

Figure 2:
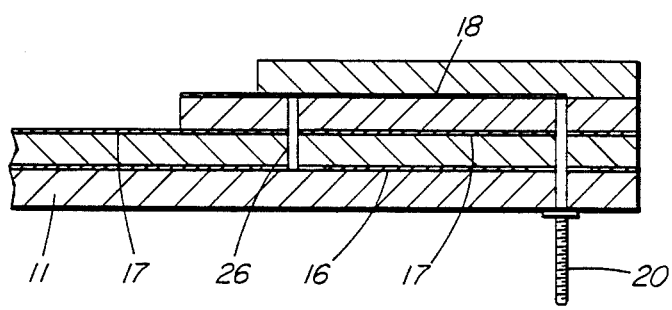
FIG. 2 is a cross-sectional side view of a first form of the package of the invention, metallization on the ground layer being shown as connected to the signal line.
Figure 3:
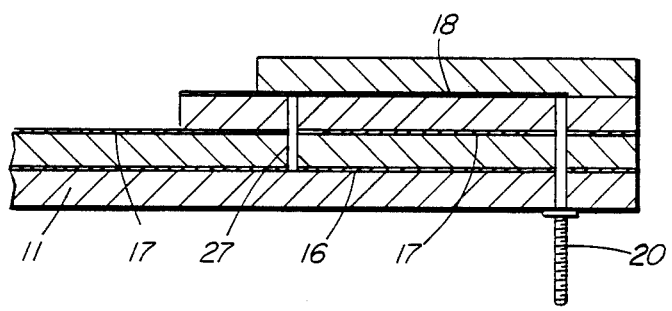
FIG. 3 is a cross-sectional side view of a first form of the package of the invention, metallization on the power layer being shown as connected to the signal line.
Figure 4:
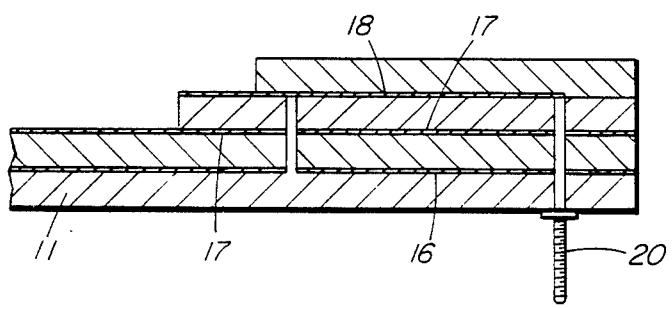
FIG. 4 is a cross-sectional side view of a second form of the package of the invention, the metal in one of a first series of apertures being connected to the metal in an associated one of another series of apertures by three metallic lines each extending on a different layer.
Figure 6:
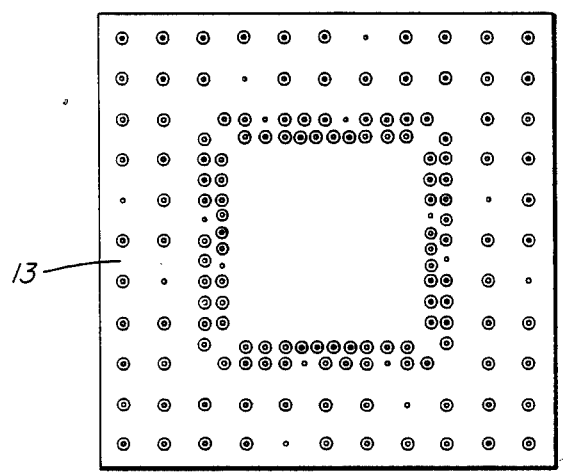
FIG. 6 is a plan view of a wafer utilized as either the outer layer or one of the inner layers in the first form of the package of the invention.

The surface metallization 16 and 17 on base layer 11 and inner layer 13, respectively, in one preferred embodiment of the package is illustrated in the plan view of FIG. 6. The surface metallization extends over the whole surface of layers 11 and 13 except for small circles surrounding the positions at which the metal in each of the 156 apertures on the inner layers intersects the layers 11 and 13. With respect to FIG. 2, the metallization 17 on inner layer 13 is connected to the metal-filled aperture to which pin 20 is also connected. If pin 20 is connected to ground voltage, metallization 17 assumes that voltage. Metallization 17 is also connected to the metal in one or more additional apertures such as the one designated 26, a controlled impedance environment being thereby provided for the metallic line 18 adjacent to the wire contact position associated with that metallic line. FIG. 3 illustrates a similar arrangement for transferring the power voltage present on the metallization 16 on base layer 11 to one or more of the additional apertures, such as the one designated 27. This embodiment of the invention results in a package that provides a controlled impedance environment for frequency sensitive applications.

Figure 7:
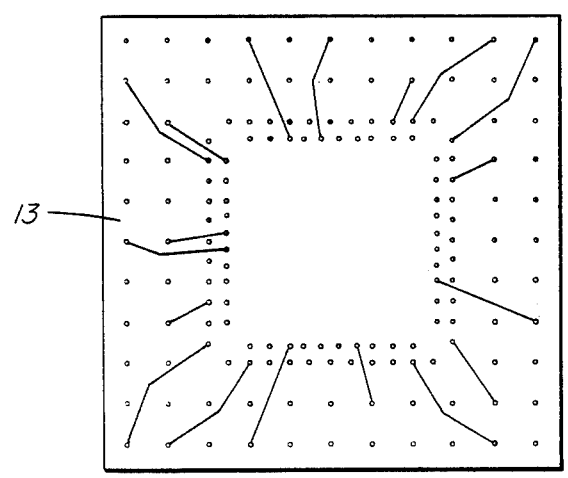
FIG. 7 is a plan view of a wafer utilized as either the outer layer or one of the inner layers in the second form of the package of the invention.

The plan view of FIG. 7 illustrates the surface metallization 16 and 17 on base layer 11 and inner layer 13, respectively, in a second preferred embodiment of the package. In this embodiment, the metallization comprises a series of connecting metallic lines each extending from a position proximate of the metal in one of the apertures to which a package pin is connected to a position proximate of the metal in an associated one of the additional apertures. The metallic lines are produced by soft tooling of the wafers prior to package fabrication. The effect of such soft tooling is to create input lines that each extend from a respective pin to an associated wire contact position but differ in resistance. The resistance is varied by including additional layers in the package, each layer having a pattern of connecting metallic lines. Resistance is varied between the inputs lines on a package by including connecting metallic lines on some layers but not on others. For instance, the inclusion of a corresponding line on three layers results in a resistance which is one-third of the resistance in each of the individual lines. It is possible to omit inner layer 13 from the package, and to place the metallization pattern shown in FIG. 7 only on base layer 11. In such case, only two corresponding lines would be possible. If better control of the resistance was necessary, the width of corresponding lines on each of the layers could also be varied. The second embodiment of the invention is useful in power sensitive applications.

Both of the described embodiments have the common feature that wafers bearing only two aperture patterns are required; one pattern is on the wafer adapted to form the outer layer that carries the pins, and the second pattern is on the one or more wafers adapted to form the inner layers. With this arrangement, hard tooling costs are kept to a minimum. The different embodiments described were created by soft tooling of an outer layer wafer having 84 apertures and one of more inner layer wafers having 156 apertures. The same series of wafers could be utilized with soft tooling to create packages for a variety of microchips.

I claim:

1. A multilayer thick film package for housing a microchip, the package being formed from a series of insulating wafers of corresponding external profile, an outer layer of the package being defined by a wafer in a first form having a first series of apertures therein adapted to be filled with electrically conductive material for connecting with pins adapted to extend from the package, each inner layer of the package being defined by a wafer in a second form having a second series of apertures therein adapted to be filled with electrically conductive material and corresponding in number and position with the apertures on each other inner layer, the second series of apertures comprising a series of apertures corresponding to the first series of apertures in number and position and also comprising a third series of apertures lacking such correspondence, electrical connections from the microchip to the package pins being adapted to be made by selective patterning of an electrically conductive coating on the first and second forms of wafer, whereby the packages for a variety of microchips can be prepared by utilizing a common first form of wafer and a common second form of wafer by varying the pattern of the electrically conductive coating on those wafers.

2. A multilayer thick film package for housing a microchip as in claim 1, wherein the electrically conductive coating extends over substantially all of one surface of the outer layer and over substantially all of one surface of a first one of the inner layers, the conductive coating on each of those layers being electrically connected with the electrically conductive material in only some of the apertures extending into the plane of the conductive coating, and wherein a second one of the inner layers has electrically conductive lines extending generally radially on its surface each line extending from the conductive material in a respective one of the first series of apertures to a wire contact position adjacent to a cavity housing the microchip, each of the conductive lines on the second one of the inner layers also contacting the conductive material in an associated one of the third series of apertures, either the outer layer or the first one of the inner layers being electrically connected to the conductive material in at least one of the first series of apertures and to the conductive material in at least one of the third series of apertures, the other of the outer layer and the first one of the inner layers being electrically connected to the conductive material in at least one of the remainder of the first series of apertures and to the conductive material in at least one of the remainder of the third series of apertures.

3. A multilayer thick film package for housing a microchip as in claim 2, wherein the outer layer is connected to the conductive material in at least one of the first series of apertures and to the conductive material in at least one of the third series of apertures for carrying power voltage, and wherein the first one of the inner layers is connected to the conductive material in at least one of the remainder of the first series of apertures and to the conductive material in at least one of the remainder of the third series of apertures for carrying ground voltage.

4. A multilayer thick film package for housing a microchip as in claim 1, wherein the outer layer and a first one of the inner layers each have electrically conductive lines extending generally radially on their surface, each of the conductive lines on the first one of the inner layers extending from the conductive material in a respective one of the first series of apertures to an associated wire contact position adjacent to a cavity housing the microchip, each of the conductive lines on the first one of the inner layers also contacting the conductive material in an associated one of the third series of apertures, the conductive lines on the outer layer each extending from the conductive material in a respective selected one of the first series of apertures to the conductive material in the associated one of the third series of apertures, whereby the resistance between each pin of the package and the associated wire contact position can be varied according to the pattern of the electrically conductive coating applied to the wafer adapted to form the outer layer of the package.

5. A multilayer thick film package for housing a microchip as in claim 4, wherein at least one other of the inner layers has electrically conductive lines extending generally radially on its surface, each of those conductive lines extending from the conductive material in a respective selected one of the first series of apertures to the conductive material in an associated one of the third series of apertures, whereby the resistance between each pin of the package and the associated wire contact position can be varied according to the pattern of the electrically conductive coating applied to the wafers adapted to form the outer layer and the at least one other of the inner layers of the package.

6. A multilayer thick film package for housing a microchip as in claim 1, wherein the package has a generally square profile, and wherein the first series of apertures are arranged in an array, each of those apertures being spaced 0.1 inches from adjacent apertures of the first series.

* * * * *